United States Patent [19]

Wheatley, Jr.

[11] 4,055,811
[45] Oct. 25, 1977

[54] TRANSISTOR AMPLIFIERS

[75] Inventor: Carl Franklin Wheatley, Jr., Somerset, N.J.

[73] Assignee: RCA Corporation, New York, N.Y.

[21] Appl. No.: 688,589

[22] Filed: May 21, 1976

[51] Int. Cl.² .......................... H03F 1/32; H03F 3/04
[52] U.S. Cl. ...................................... 330/289; 323/4;
330/296; 330/297; 330/256; 330/257
[58] Field of Search ............. 307/310; 323/4; 330/18, 330/19, 22, 23, 30 D

[56] References Cited

U.S. PATENT DOCUMENTS

| 3,077,566 | 2/1963 | Vosteen | 330/30 D X |
| 3,939,434 | 2/1976 | Crosby | 330/23 X |

Primary Examiner—Lawrence J. Dahl
Attorney, Agent, or Firm—H. Christoffersen; S. Cohen; A. L. R. Limberg

[57] ABSTRACT

The collector currents of first and second junction transistors which have base electrodes biased at the same quiescent potential and have emitter electrodes connected via respective emitter degeneration resistances to a common point, are adjusted relative to each other. This is done by applying linearly temperature-dependent voltages in adjustable ratio with each other to the emitter degeneration resistances. This makes it so that the adjustment of the relative values of the collector currents is substantially unchanging over a temperature range.

5 Claims, 6 Drawing Figures

TRANSISTOR AMPLIFIERS

The present invention relates to transistor amplifiers having adjustable current gains or relative quiescent current levels and, more particularly, to such amplifiers susceptible of fabrication in mostly monolithic integrated circuit form, in which the adjustments are not substantially affected by temperature change.

Certain prior art transistor amplifiers, either of the current mirror type or the emitter-coupled differential amplifier type, commonly employ first and second transistors with their emitter electrodes connected to a common point by respective emitter degeneration resistances and having essentially equal quiescent potentials applied to their base electrodes to forward-bias their base-emitter junctions. It has been common practice in the prior art to adjust the relative transconductance of these transistors by a potentiometer connected at its two ends to the two transistor emitter electrodes, respectively, and at its adjustable tap-point terminal to the common point. The potentiometer provides push-pull trim of the two emitter degeneration resistances for adjusting the relative amounts by which the transistors are degenerated by current feedback, thereby adjusting the relative transconductances of the transistors.

The shortcoming of this practice is that the temperature of the potentiometer is not easily constrained to change in the same manner as the temperature of the emitter degeneration resistors, nor does the resistance of the potentiometer exhibit a temperature coefficient similar to that of the emitter degeneration resistances. As a result, the current gain adjustment with this prior art method tends to be undesirably temperature-sensitive. Precisely correct current gain is achieved only at a specific transistor operating temperature.

In a transistor amplifier embodying the present invention, the collector currents of first and second junction transistors, which have base electrodes biased at the same quiescent potential and have emitter electrodes connected via respective emitter degeneration resistances to a common point are adjusted relative to each other by applying linearly temperature-dependent potentials at least one of which is adjustable to the emitter degeneration resistances, thereby to achieve an adjustment of the relative values of the collector currents that is substantially unchanging over a range of temperatures.

Figure 1:
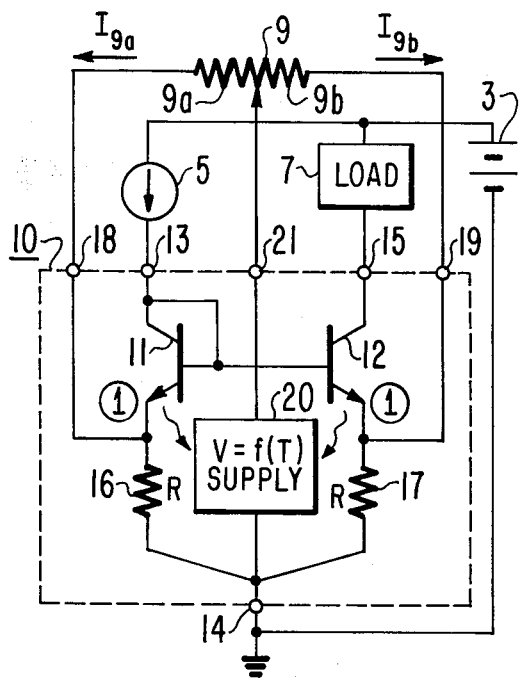
FIG. 1 is a schematic diagram of a current mirror amplifier having a current gain, which is nominally minus unity and is adjustable according to the present invention.

Current mirror amplifier 10 of FIG. 1 has an input port between its input terminal 13 and common terminal 14 and has an output port between common terminal 14 and output terminal 15. A supply 3 of operating potential is grounded at its negative terminal and is connected at its positive terminal through a source 5 of input current to input terminal 13 and through a load 7 to output terminal 15. Transistors 11 and 12 have their respective collector electrodes galvanically coupled to input terminal 13 and to output terminal 15, respectively; each of these galvanic couplings is shown as consisting of a direct connection in FIG. 1, but other known forms of galvanic coupling may be used instead. The emitter electrodes of transistors 11 and 12 are galvanically coupled to the common terminal 14, via resistances 16 and 17, respectively.

Transistor 11 is provided with direct-coupled collector-to-base feedback to adjust its base potential to such value as to condition its collector-to-emitter path to conduct the input current supplied to input terminal 13, except for the small portion thereof used to sustain base current flows in transistors 11 and 12. This collector-to-base feedback is shown in FIG. 1 as being applied by direct connection, but alternative circuits for applying the feed-back can be used instead--e.g., an emitter-or source-follower transistor. Means are provided for applying a base potential to transistor 12 which is the same as that applied to transistor 11; in FIG. 1 this means is shown as comprising the direct connection of the base electrodes of transistors 11 and 12 to each other.

The emitter electrodes of transistors 11 and 12 are connected to terminals 18 and 19, respectively. A potentiometer 9 has its end terminals connected at terminal 18 and at terminal 19, respectively. A supply 20 of potential $V_{20}$ increasing and decreasing with increase and decrease, respectively, of the absolute temperature T of transistors 11 and 12, which are thermally coupled to the supply, is connected between terminal 14 and terminal 21. There are a number of ways the supply 20 (and 40 of FIGS. 4 – 6) may be implemented. These are discussed at the end of the application. Potentiometer 9 has its adjustable tap-point terminal connected to terminal 21, so segment 9a of its resistance is between terminals 18 and 21 and segment 9b of its resistance is between terminals 19 and 21.

In explaining the present invention, it is convenient to assume that the base currents of transistors 11 and 12 are negligibly small as compared to their collector currents. For integrated-circuit transistors of vertical structure, this is a close approximation, since common-emitter forward current gains ($h_{fe}$'s) in excess of 70 or so are easily attained in the manufacture of such transistors. For lower-$h_{fe}$ transistors, the same result can be obtained by applying direct-coupled collector-to-base feedback to transistor 11 via a source-follower field effect transistor or via an emitter-follower bipolar transistor. So, as a good approximation, the current gain G of current mirror amplifier 10 can be expressed as a ratio between the collector currents $I_{C11}$ and $I_{C12}$ of transistors 11 and 12, respectively. Also, many times a current mirror amplifier will be followed in direct coupled cascade by a common-emitter amplifier designed to have a base current flow from the output circuit of the current mirror amplifier equal to the base current flows to its own transistors from its input circuit. In any case, one skilled in the art of designing electronic circuits with transistors will be able to modify appropriately the teachings below in situations where low $h_{fe}$ of the current mirror amplifier transistors requires taking their base currents into account.

$$G = -I_{C12}/I_{C11} \tag{1}$$

Transistors 11 and 12, like any other bipolar transistors, can have their operation quite accurately described by the following well-known equation.

$$V_{BE} = (kT/q)lnI_C/J_S A \tag{2}$$

where
$V_{BE}$ is the base-emitter potential of the transistor,
$k$ is Boltzmann's constant,
$T$ is the absolute temperature of the transistor,
$q$ is the charge on an electron,
$I_C$ is the collector current of the transistor, and
$J_S$ is the collector current of the transistor under $V_{BE} = 0$ conditions, divided by the effective area A of the base-emitter junction of the transistor.

The constants $k$ and $q$ are universal, applying to all transistors. Transistors 11 and 12 are operated at substantially the same absolute temperature $T$. They are made of the same basic semiconductor material, preferably by the same diffusion and/or ion implantation steps and are assumed to have the same value of $J_S$. $V_{BE}$, $I_C$ and A will be subscripted with the identification numeral of the transistor.

In the drawing, the areas of the base-emitter junctions of transistors, expressed in arbitrarily chosen units of area, are indicated by encircled terms near the emitter electrodes of the respective transistors. The encircled numbers near the emitter electrodes of transistors 11 and 12 in current mirror amplifier 10 of FIG. 1 are each unity giving rise to equation 3.

$$A_{11} = A_{12} \tag{3}$$

Equation 2 can be written to describe each of transistors 11 and 12 as follows:

$$V_{BE11} = (kT/q)ln(I_{C11}/J_S A_{11}) \tag{4}$$

$$V_{BE12} = (kT/q)ln(I_{C12}/J_S A_{12}) \tag{5}$$

The difference between $V_{BE12}$ and $V_{BE11}$ can be determined to be proportional to the logarithm of $I_{C11}$ and $I_{C12}$ by combining equations 4 and 5 as follows:

$$(V_{BE12} - V_{BE11}) = (kT/q)ln(A_{11}/A_{12}) + (kT/q)ln(I_{C12}/I_{C11})$$
$$= (kT/q)ln(1) + (kT/q)ln(I_{C12}/I_{C11}) = (kT/q)ln(I_{C12}/I_{C11}) \tag{6}$$

The present invention is based on the observation that so long as the potential $V_{BE12} - V_{BE11}$ changes linearly with T, but is otherwise unchanging, $ln(I_{C12}/I_{C11})$ is invariant. Thus, $G = -I_{C12}/I_{C11}$ is invariant. One may change $-I_{C12}/I_{C11}$ to a new value by changing $(V_{BE12} - V_{BE11})$. But so long as $(V_{BE12} - V_{BE11})$ is made to change proportionally with temperature, the current gain $G = -I_{C12}/I_{C11}$ will still be maintained despite temperature change.

Adjustment of the current gain G of current mirror amplifier 10 is effected by changing the setting of the potentiometer 9. Decreasing the resistance of segment 9a and increasing the resistance of segment 9b will decrease $V_{BE11}$ relative to $V_{BE12}$, reducing $I_{C11}$ relative to $I_{C12}$, and so increase the current gain G of current mirror amplifier 10. On the other hand, decreasing the resistance of segment 9b and increasing the resistance of segment 9a will decrease $V_{BE12}$ relative to $V_{BE11}$, reducing $I_{C12}$ relative to $I_{C11}$, and so decrease the current gain of current mirror amplifier 10.

In current mirror amplifier 10, the following observation can be made, where $V_{16}$ and $V_{17}$ are the potential drops across resistances 16 and 17, respectively.

$$V_{BE11} + V_{16} = V_{BE12} + V_{17} \tag{7}$$

Therefore, $$V_{BE12} - V_{BE11} = V_{16} - V_{17} \tag{8}$$

If the difference between $V_{16}$ and $V_{17}$ can be made to change in proportion to $T$, then current mirror amplifier 10 should exhibit substantially fixed current gain despite change in $T$ because $V_{BE12} - V_{BE11}$ will have the desired relationship to $T$. So, a calculation of the effects of the application of $V_{20}$ through potentiometer 9 to the resistances 16 and 17 upon $V_{16}$ and $V_{17}$ must be undertaken. The currents $I_{9a}$ and $I_{9b}$ flowing respectively through resistance $R_{9a}$ of potentiometer segment 9a and through resistance $R_{9b}$ of potentiometer segment 9b are described by the following equations.

$$I_{9a} = (V_{20} - V_{16})/R_{9a} \tag{9}$$

$$I_{9b} = (V_{20} - V_{17})/R_{9b} \tag{10}$$

The total current flow through resistance 16 is the sum of $I_{9a}$ and the emitter current, $I_{E11}$ of transistor 11, and the total current flow through resistor 17 is the sum of $I_{9b}$ and the emitter current $I_{E12}$ of transistor 12. By Ohm's Law, equations 11 and 12 can then be written $$V_{16} = (I_{E11} + I_{9a}) R \tag{11}$$

$$V_{17} = (I_{E12} + I_{9b}) R \tag{12}$$

Combining equations 9 and 11 and rearranging, gives equation 13 below. Equation 14 is obtained in similar fashion from equations 10 and 12.

$$V_{16} = [R\,R_{9a}/(R_{9a}+R)]I_{E11} + [R/R_{9a}+R)]V_{20} \tag{13}$$

$$V_{17} = [R\,R_{9b}/(R_{9b}+R)]I_{E12} + [R/R_{9b}+R)]V_{20} \tag{14}$$

In the present invention, it is desired to make $V_{16}$ and $V_{17}$ substantially independent of $I_{E11}$ and $I_{E12}$ and primarily dependent upon $V_{20}$. To this end, $I_{E11}$ and $I_{E12}$ are kept small compared to the possible values of $I_{9a}$ and $I_{9b}$—that is, practically speaking, to $V_{20}$ divided by the resistance $R_{9a} + R_{9b}$ of potentiometer 9. Also, $R_{9a}$ and $R_{9b}$ are each kept larger than R. Then, equations 13 and 14 are adequately approximated by equations 15 and 16, following.

$$V_{16} = R\,V_{20}/(R_{9a} + R) \tag{15}$$

$$V_{17} = R\,V_{20}/(R_{9b} + R) \tag{16}$$

In a first, preferred form of the present invention, R, $R_{9a}$, $R_{9b}$, $R_{16}$ and $R_{17}$ are all made to have coefficients of change with temperature as close to zero as possible. Insofar as resistors 16 and 17 are concerned, this can be done by making them heavily doped, diffused or ion-implanted resistive elements in a monolithic integrated circuit with transistors 11 and 12, or by making them from resistive film on the surface of an integrated circuit, or by making them properly selected discrete resistors. Potentiometer 9 can be made to have a resistance which remains constant by removing it from the thermal environment of transistors 11 and 12 and operating it in an environment not subject to temperature change. If not so operated, its resistance change with temperature should be made as low as possible by, for example, choice of an appropriate resistance material. Equation 17, following, results from substracting equation 16 from 15.

$$V_{16} - V_{17} = \{R(R_{9b} - R_{9a})/[R_{9a}R_{9b} + (R_{9a} + R_{9b})R + R^2]\} V_{20} \quad (17)$$

It is clear from this equation that with R, $R_{9a}$ and $R_{9b}$ all substantially temperature-independent, the term ($V_{16} - V_{17}$) will have a coefficient of change with temperature like that of $V_{20}$. By making $V_{20}$ vary linearly with absolute temperature T of transistors 11 and 12, the desired proportionality between ($V_{BE12} - V_{BE11}$) and $T$ will be obtained.

Should the resistance R of elements 16 and 17 exhibit dependence of the absolute temperature T of transistors 11 and 12—e.g., as may occur when elements 16 and 17 are integrated with transistors 11 and 12 in a monolithic integrated circuit and are diffused simultaneously with the base regions of transistors 11 and 12—this can be quite easily accomodated if $R_{9a}$ and $R_{9b}$ are always maintained substantially larger than R. Then, equations 15 and 16 can be adequately approximated by equations 18 and 19, respectively.

$$V_{16} = (R/R_{9a}) V_{20} \quad (18)$$

$$V_{17} = (R/R_{9b}) V_{20} \quad (19)$$

$$V_{16} - V_{17} = R[(R_{9b} - R_{9a})/R_{9a} R_{9b}] V_{20} \quad (20)$$

Equation 20 obtained by subtractively combining equations 18 and 19 can be rewritten in logarithmic form and differentiated with respect to absolute temperature.

$$ln(V_{16} - V_{17}) = ln R + ln(R_{9b} - R_{9a}) - lnR_{9a} - lnR_{9b} + ln V_{20} \quad (21)$$

$$[d(V_{16} - V_{17})/dT]/(V_{16} - V_{17}) = (dR/dT)/R + [d(R_{9b} - R_{9a})/dT]/(R_{9b} - R_{9a}) - (dR_{9a}/dT)/R_{9a} - (dR_{9b}/dT)/R_{9b} + (d V_{20}/dT)/V_{20} \quad (22)$$

Assuming $(R_{9b} - R_{9a})$, $R_{9a}$, and $R_{9b}$, the resistances of potentiometer 9, all to be temperature-independent, all except the first and last terms on the right hand side of equation 22 are zero-valued, and equation 23 results.

$$(d V_{20}/dT)/V_{20} = [d(V_{16} - V_{17})/dT]/(V_{16} - V_{17}) - (dR/dT)/R \quad (23)$$

By making the percentage change in $V_{20}$ equal to the desired 0.3% change in $V_{16} - V_{17}$ per degree temperature change less the percentage change in R per degree temperature change, the desired proportionality of $V_{BE12} - V_{BE11}$ to $T$ for a stable adjustment of $G = -I_{C12}/I_{C11}$ is achieved.

Figure 2:
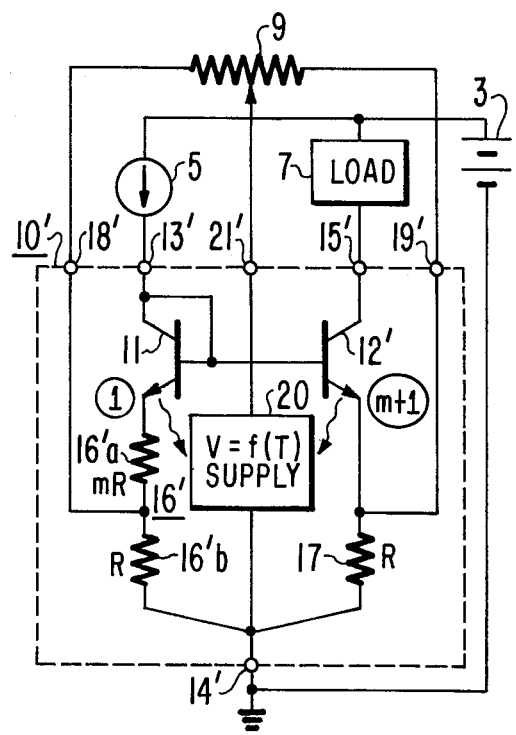
FIGS. 2 and 3 are schematic diagrams of current mirror amplifiers with nominal current gains respectively larger than and smaller than minus unity, each adjusted per the present invention.

FIG. 2 shows how the FIG. 1 current mirror amplifier 10 may be modified to form a current mirror amplifier 10' having a current gain of $-(m+1)$, where $m$ is a positive number. Transistor 12' has a base-emitter junction with an effective area $(m+1)$ times as large as that of the base-emitter junction of transistor 11. The emitter degeneration resistance 16' of transistor 11 is in two segments 16'a and 16'b which have respective resistances $m$ times and unity times, respectively, as large as the emitter degeneration resistance 17 of transistor 12'.

These foregoing connections in current mirror amplifier 10' condition its transistor 12' to have a collector current $I_{C12'}$, nominally $(m+1)$ times the collector current $I_{C11}$ of transistor 11, absent current flows via potentiometer 9 to terminals 18' and 19'.

Now, as long as the emitter current flows in a pair of transistors are logarithmically related to their respective base-emitter potentials, per equations 4 and 5, they will experience the same percentage change in their collector currents for a given incremental change in each of their base-emitter potentials no matter what their respective current levels. This can be seen by simply differentiating equations 4 and 5 and comparing them. To operate potentiometer 9 about in the center of its range of setting, while its one end terminal is still connected to the end of resistance 17 remote from common terminal 14, its other end is connected—not to the end of resistance 16' remote from common terminal 14 (which can alternatively be done)—but rather to a tap point on resistance 16' having a resistance R to common terminal 14.

Figure 3:
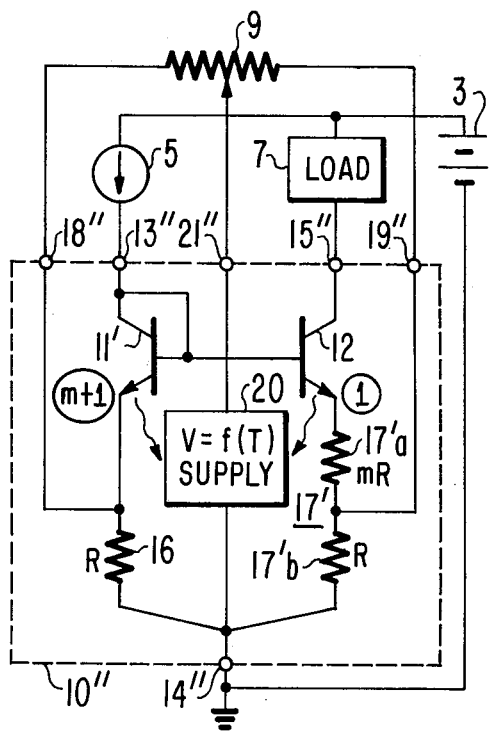

FIG. 3 shows how the FIG. 1 current mirror amplifier may be modified to form a current mirror amplifier 10'' having a current gain of $-1/(m+1)$. Transistor 11' has a base-emitter junction with an effective area $(m+1)$ times as large as that of the base-emitter junction of transistor 12. The emitter degeneration resistance 17' of transistor 12 is in two segments 17'a and 17'b which have respective resistances $m$ times and unity times, respectively, as large as the emitter degeneration resistance 16 of transistor 11'. These foregoing connections in current mirror amplifier 10'' condition its transistor 12 to have a collector current $I_{C12}$ nominally $1/(m+1)$ times the collector current $I_{C11'}$ of transistor 11', absent current flows via potentiometer 9 to terminals 18'' and 19''.

Figure 4:
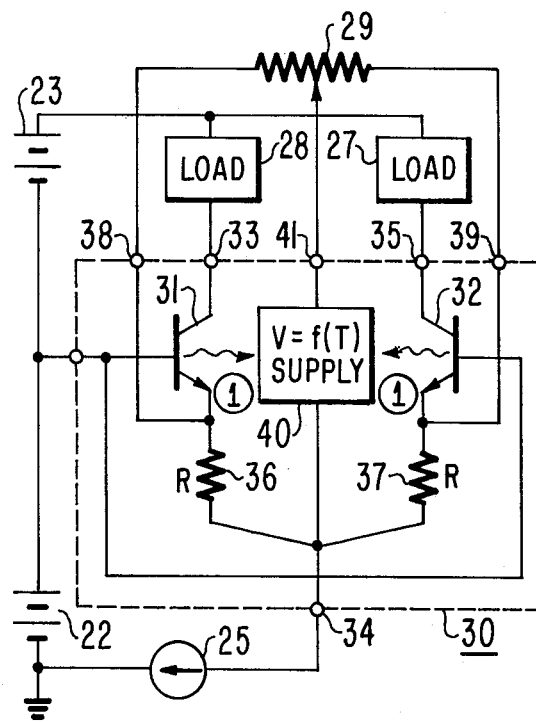
FIG. 4 is a current divider using emitter-coupled transistors with the division of currents adjusted per the present invention.
Figure 5:
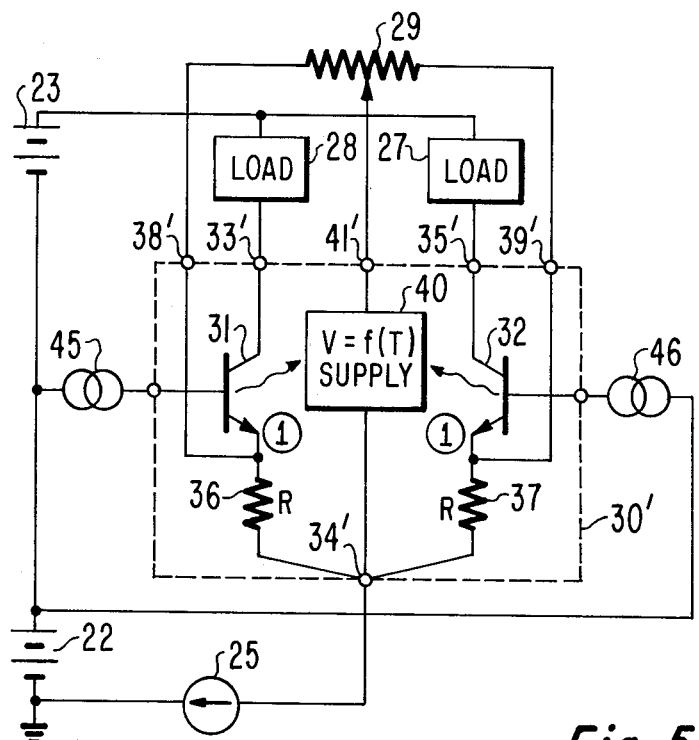
FIG. 5 is a schematic diagram of an emitter-coupled transistor differential amplifier nominally operated with equal emitter currents, their relative values adjusted per the present invention.

The current divider 30 of FIG. 4 has transistors 31 and 32 operated under similar direct-current conditions as transistors 11 and 12 of current mirror amplifier 10. Transistors 31 and 32 have their base electrodes connected together to receive a bias potential provided at the interconnection of the positive and negative terminals of direct potential supplies 22 and 23, respectively. Transistors 31 and 32 have their respective emitter electrodes connected to a common terminal 34 via emitter degeneration resistances 36 and 37, respectively. The resistances of elements 36 and 37 are in inverse proportion to the areas of the base-emitter junctions of transistors 31 and 32, respectively.

The current demanded by current source 25 connecting terminal 34 to the negative terminal of supply 22 is supplied by the combined emitter currents of transistors 31 and 32 flowing in a ratio nominally equal to the ratio of their respective base-emitter junction areas. Responsive to their respective emitter currents $I_{E31}$ and $I_{E32}$, transistors 31 and 32 demand respective collector currents $I_{C31}$ and $I_{C32}$ from the positive terminal of supply 23. $I_{C31}$ and $I_{C32}$ are drawn through loads 28 and 27, respectively, and then through branch terminals 33 and 35, respectively. $I_{C31}$ and $I_{C32}$ are substantially equal to $I_{E31}$ and $I_{E32}$, respectively, except for the portions of $I_{E31}$ and $I_{E32}$ flowing as respective base currents. In any case, the ratio of $I_{C31}$ to $I_{C32}$ is the same as the ratio of $I_{E31}$ to $I_{E32}$.

The end terminals of potentiometer 29 are connected via terminals 38 and 39, respectively, to the emitter electrodes of transistors 31 and 32, respectively. Its adjustable tap-point terminal is connected to terminal 41. A supply 40 of potential sensitive to the absolute temperature at which transistors 31 and 32 are operated is connected to apply that potential between terminals 34 and 41. The relative values of $I_{C31}$ and $I_{C32}$ are trimmed in the same way as the relative values of $I_{C11}$ and $I_{C12}$ are trimmed in the FIG. 1 current mirror amplifier 10.

Figure 6:
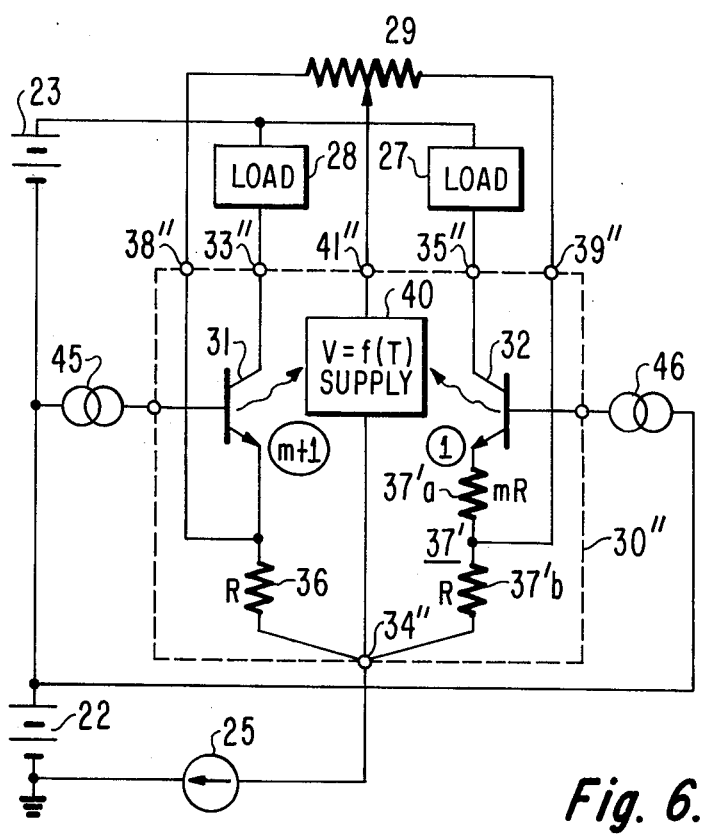
FIG. 6 is a schematic diagram of an emitter-coupled transistor pair operated with unbalanced emitter currents, their relative values adjusted per the present invention.

The current divider 30 provides the basic quiescent circuit equivalent for an emitter-coupled differential amplifier. All that is missing is means for applying input signal between the base electrodes of transistors 31 and 32. This can, for example, be done as shown in emitter-coupled differential amplifier 30' of FIG. 5, where balanced signal potential sources 45 and 46 are connected between the base electrodes of transistors 31 and 32, and are referred to the potential at the interconnection of supplies 22 and 23. FIG. 6 shows an unbalanced emitter-coupled differential amplifier having its degree of unbalance adjusted in the same manner as suggested for the current mirror amplifiers 10' and 10'' of FIGS. 2 and 3.

In any of the apparatuses 10, 10', 10'', 30, 30', 30'', a fixed resistor may replace segment 9a of potentiometer 9 and an adjustable resistor may replace segment 9b of potentiometer 9, or vice versa. Also, potentiometer 9 may be replaced by a potentiometer with stop resistors connecting its end terminals to terminals 18, 19; 18', 19'; 18'', 19''; 38, 39; 38', 39'; 38'', 39'' to provide for a reduced range of gain adjustment. Supplies 20 and 40 are usually more conveniently integrated if poled with their positive terminals connected to the adjustable tap terminal of the potentiometer for adjusting the relative conduction of NPN transistors, but may be poled the opposite way.

The remaining thing to consider is the construction of the temperature-sensitive supplies 20 and 40. Where it is desired to make such a supply to provide a potential linearly related to absolute temperature T, a temperature-dependent voltage reference circuit as described in U.S. Pat. No. 3,851,241 is recommended. These supplies require no adjustment to give desired potential versus temperature coefficient. This is the reason it is desirable to make the resistances of elements 16, 17, 16', 17', 36, 37, 37' either linearly dependent upon temperature or temperature-independent, if possible.

Potential supplies with different temperature coefficients are available based on combining the offset potential across a forward-biased semiconductor junction and the difference between the offset potentials of a pair of forward-biased semiconductor junctions in varying proportion. Supplies using combinations of semiconductor junctions some operated in forward conduction and some in avalanche are also available.

In the claims, "normal transistor operation" refers to the conditions where the collector-base junction of a transistor is reverse-biased, biased for equal collector and base voltages, or forward-biased in sufficiently low degree that the collector current due to the flow of current through the forward-biased junction is the lesser component of collector current. That is, during normal transistor operation, collector current flow is the conventional direction, into the collector electrode for a NPN or out of the collector electrode for a PNP.

What is claimed is:

1. In a transistor amplifier including:

first and second transistors of the same conductivity type, both fabricated from the same basic semiconductor material and operated at substantially the same absolute temperature T, each having base and emitter and collector electrodes, each having a base-emitter junction between its base and emitter electrodes, each having a collector-base junction between its collector and base electrodes;

first and second resistances exhibiting similar coefficients of change with change in temperature and being operated at substantially said absolute temperature T;

said first resistance having a first end connected to the emitter electrode of said first transistor and having a second end, and said second resistance having a first end connected to the emitter electrode of said second transistor and having a second end;

an interconnection of the second ends of said first and said second resistances;

means for applying substantially the same quiescent potentials to the base electrodes of said first and said second transistors, of a polarity respective to a potential at said interconnection for forward-biasing the base-emitter junction of said first and said second transistors;

means for applying a quiescent potential to the collector electrode of said first transistor to condition it for normal transistor operation; and means for applying a quiescent potential to the collector electrode of said second transistor to condition it for normal transistor operation, an improvement for controlling the ratio between the collector currents of the first and second transistors substantially independently of temperature in the operating temperature range of said first and second transistors which improvement comprises:

means for developing across said first resistance a potential drop linearly proportional to T in the operating temperature range of said first and second transistors;

means for developing across said second resistance a potential drop linearly proportional to T in the operating temperature range of said first and second transistors; and means for adjusting at least one of the potential drops across said first and second resistances relative to the other.

2. In a transistor amplifier including:

first and second transistors of the same conductivity type, both fabricated from the same basic semiconductor material and operated at substantially the same absolute temperature T, each having base and emitter and collector electrodes, each having a base-emitter junction between its base and emitter electrodes, each having a collector-base junction between its collector and base electrodes;

first and second resistances exhibiting similar coefficients of change with change in temperature and being operated at substantially said absolute temperature T;

said first resistance having a first end connected to the emitter electrode of said first transistor and having a second end, and said second resistance having a first end connected to the emitter electrode of said second transistor and having a second end;

an interconnection of the second ends of said first and said second resistances;

means for applying substantially the same quiescent potentials to the base electrodes of said first and said second transistors, of a polarity respective to a potential at said interconnection for forward-biasing the base-emitter junction of said first and said second transistors;

means for applying a quiescent potential to the collector electrode of said first transistor to condition it for normal transistor operation; and means for applying a quiescent potential to the collector electrode of said second transistor to condition it for normal transistor operation;

third and fourth substantially temperature-independent resistances, having respective first ends respectively connected to separate ones of the first ends of said first and said second resistances and having respective second ends, at least one of which third and fourth resistances is adjustable, for adjusting the relative collector currents of said first and said second transistors; and an interconnection of the second ends of said third and said fourth resistances, the improvement comprising:

means applying a potential, which potential changes in proportion to the change in the absolute temperature T at which said first and said second transistors are operated, between said interconnection of the second ends of said first and said second resistances and said interconnection of the second ends of said third and said fourth resistances for reducing the temperature dependence of the adjustment of the relative values of the collector currents of said first and said second transistors.

3. An improved transistor amplifier as set forth in claim 2 wherein said first and said second resistances have substantially zero coefficients of change with temperature change and wherein said means applying a potential applies a potential which is linearly proportional to the absolute temperature T at which said first and said second transistors are operated.

4. In a transistor amplifier including:

first and second transistors of the same conductivity type, both fabricated from the same basic semiconductor material and operated at substantially the same absolute temperature T, each having base and emitter and collector electrodes, each having a base-emitter junction between its base and emitter electrodes, each having a collector-base junction between its collector and base electrodes;

first and second resistances exhibiting similar coefficients of change with change in temperature and being operated at substantially said absolute temperature T, said first resistance having a first end connected to the emitter electrode of said first transistor and having a second end, and said second resistance having a first end connected to the emitter electrode of said second transistor and having a second end;

an interconnection of the second ends of said first and said second resistances;

means for applying substantially the same quiescent potentials to the base electrodes of said first and said second transistors, of a polarity respective to a potential at said interconnection for forward-biasing the base-emitter junction of said first and said second transistors;

means for applying a quiescent potential to the collector electrode of said first transistor to condition it for normal transistor operation;

means for applying a quiescent potential to the collector electrode of said second transistor to condition it for normal transistor operation; and a potentiometer, having a resistive body between first and second end terminals respectively connected to the first end of said first resistance and to the first end of said second resistance and having an adjustable tap-point terminal on its resistive body, whereby the setting of said tap-point terminals adjusts the relative values of the collector currents of said first and said second transistors, the improvement comprising:

means applying a potential, which potential changes in proportion to the change in the absolute temperature T at which said first and said second transistors are operated, between said interconnection and said adjustable tap-point terminal, for reducing the temperature dependency of the adjustment of the relative values of the collector currents of said first and said second transistors.

5. An improved transistor amplifier as set forth in claim 4 wherein said first and said second resistances and the resistance of the resistive body of said potentiometer each have a substantially zero coefficient of change with temperature change and wherein said means applying a potential applies a potential which is linearly proportional to the absolute temperature T at which said first and said second transistors are operated.

* * * * *